(12) United States Patent
Fu et al.

(10) Patent No.: US 8,533,638 B2
(45) Date of Patent: Sep. 10, 2013

(54) POST-OPTICAL PROXIMITY CORRECTION PHOTORESIST PATTERN COLLAPSE RULE

(75) Inventors: Kuo Kuei Fu, Guishan Township (TW); Yi Nan Chen, Taipei (TW); Hsien Wen Liu, Luzhu Township (TW)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 167 days.

(21) Appl. No.: 13/079,869

(22) Filed: Apr. 5, 2011

(65) Prior Publication Data

US 2012/0258386 A1    Oct. 11, 2012

(51) Int. Cl.
*G06F 17/50*    (2006.01)
(52) U.S. Cl.
USPC ............. 716/53; 716/50; 716/51; 716/54; 716/55
(58) Field of Classification Search
None
See application file for complete search history.

(56) References Cited

U.S. PATENT DOCUMENTS

| | | | |
|---|---|---|---|
| 7,592,129 B2* | 9/2009 | Watanabe | 430/311 |
| 7,611,825 B2* | 11/2009 | Chang et al. | 430/311 |
| 2006/0057507 A1* | 3/2006 | Chang et al. | 430/327 |

* cited by examiner

*Primary Examiner* — A. M. Thompson
(74) *Attorney, Agent, or Firm* — Novak Druce Connolly Bove + Quigg LLP

(57) ABSTRACT

A model of defining a photoresist pattern collapse rule is provided. A portion of the photoresist pattern which corresponds to a second line pattern of a photomask layout is defined as non-collapse patterns if $d \geq 5a$ and $c \geq 1.5b$ or if $5a > d \geq 3a$ and $c \geq 1.2b$, wherein b is the widths of two first line patterns, c is the width of a second line pattern of the photomask layout, and a and d are distances between the second line pattern and the two first line patterns. Accordingly, a photomask layout, a semiconductor substrate and a method for improving photoresist pattern collapse for post-optical proximity correction are also provided.

5 Claims, 5 Drawing Sheets

POST-OPTICAL PROXIMITY CORRECTION PHOTORESIST PATTERN COLLAPSE RULE

TECHNICAL FIELD

The present invention relates to a model of defining a photoresist pattern collapse rule, and a photomask layout, a semiconductor substrate and a method for improving photoresist pattern collapse, and more particularly, to a model of defining a photoresist pattern collapse rule, and a photomask layout, a semiconductor substrate and a method for improving photoresist pattern collapse for post-optical proximity correction (post-OPC).

BACKGROUND

With the rapid development of integrated circuit fabrication processes, cells in modern integrated circuits are fabricated in a more compact manner and have smaller pitches than cells in conventional integrated circuits. For example, pitch requirements for integrated circuit fabrication processes have evolved from micron level to nanometer level. Accordingly, lithography has to be precisely performed in order for layout patterns to be accurately exposed via masks before being mapped to semiconductor wafers.

Photoresist materials are used with patterning and etching techniques to form structures such as integrated circuit layouts. In particular, integrated circuit layout geometries have dramatically decreased in size. As the integrated circuit layouts decrease in size, so do the layouts of the photoresist material used to pattern the features into the integrated circuit layouts. Photoresist material may be deposited, exposed, and then developed to create the photoresist pattern. When immersion development is utilized, the developing solution may be rinsed from the integrated circuit layout with deionized water. With smaller feature sizes, the adhesion force of the photoresist material to an anti-reflective coating (ARC) or even an adhesion promoting layer deposited on the ARC layer may approach the point where the capillary force of the drying water exceeds the adhesion force. When the capillary force exceeds the adhesion force, the pattern may collapse, especially in areas including dense line patterns and sparse line patterns adjacent to each other. If the pattern collapses, the integrated circuit layout becomes defective because effective etching of features into the integrated circuit layout cannot be performed.

Therefore, there is a need for a model of defining a photoresist pattern collapse rule, as well as for a photomask layout, a semiconductor substrate and a method for improving photoresist pattern collapse.

SUMMARY

One aspect of the present invention provides a model of defining a photoresist pattern collapse rule to check for photoresist pattern collapse. In one embodiment of the present invention, a model of defining a photoresist pattern collapse rule comprises two first dimensions, a second dimension, a third dimension and a fourth dimension. The two first and second dimensions correspond to two first widths b of two first line patterns and a second width c of a second line pattern of a photomask layout, wherein the second line pattern is between and substantially parallel to the two first line patterns, and the third and fourth dimensions correspond to a first distance a and a second distance d between the second line pattern and the two first line patterns. A portion of the photoresist pattern which corresponds to the second line pattern is defined as non-collapse patterns if $d \geq 5a$ and $c \geq 1.5b$ or if $5a > d \geq 3a$ and $c \geq 1.2b$.

Another aspect of the present invention provides a photomask layout for preventing photoresist pattern collapse for post-optical proximity correction. In one embodiment of the present invention, a photomask layout for preventing photoresist pattern collapse for post-optical proximity correction comprises at least one region which includes two first line patterns having a first width b and a second line pattern having a second width c. The second line pattern is between and substantially parallel to the two first line patterns, and there exist a first distance a and a second distance d between the second line pattern and the two first line patterns. A portion of the photoresist pattern which corresponds to the second line pattern is defined as non-collapse patterns if $d \geq 5a$ and $c \geq 1.5b$ or if $5a > d \geq 3a$ and $c \geq 1.2b$.

Another aspect of the present invention provides a semiconductor substrate including a photoresist layer which has a photoresist pattern for preventing photoresist pattern collapse for post-optical proximity correction. In one embodiment of the present invention, a semiconductor substrate includes a photoresist layer which has a photoresist pattern for preventing photoresist pattern collapse for post-optical proximity correction. The photoresist pattern comprises at least one region which includes two first line patterns and at least one second line pattern. The photoresist pattern corresponds to a photomask layout comprising at least one region which includes two first line patterns having a first width b and a second line pattern having a second width c. The second line pattern of the photomask layout is between and substantially parallel to the two first line patterns of the photomask layout, and there exist a first distance a and a second distance d between the second line pattern and the two first line patterns of the photomask layout. A portion of the photoresist pattern which corresponds to the second line pattern of the photomask layout is defined as non-collapse patterns if $d \geq 5a$ and $c \geq 1.5b$ or if $5a > d \geq 3a$ and $c \geq 1.2b$.

Another aspect of the present invention provides a method for defining photoresist pattern collapse for post-optical proximity correction to check for photoresist pattern collapse. In one embodiment of the present invention, a method for defining photoresist pattern collapse for post-optical proximity correction comprises the steps of: collecting collapse conditions of at least one test photomask layout according to collapse portions of at least one test photoresist pattern which is formed by the at least one test photomask layout; constructing a photoresist pattern collapse rule according to the collapse conditions; performing an OPC to define a photoresist pattern with a photomask layout; and checking for collapse of the photoresist pattern according to the photoresist pattern collapse rule.

The foregoing has outlined rather broadly the features of the present invention in order that the detailed description of the invention to follow may be better understood. Additional features of the invention will be described hereinafter and form the subject of the claims of the invention. It should be appreciated by those skilled in the art that the concept and specific to embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
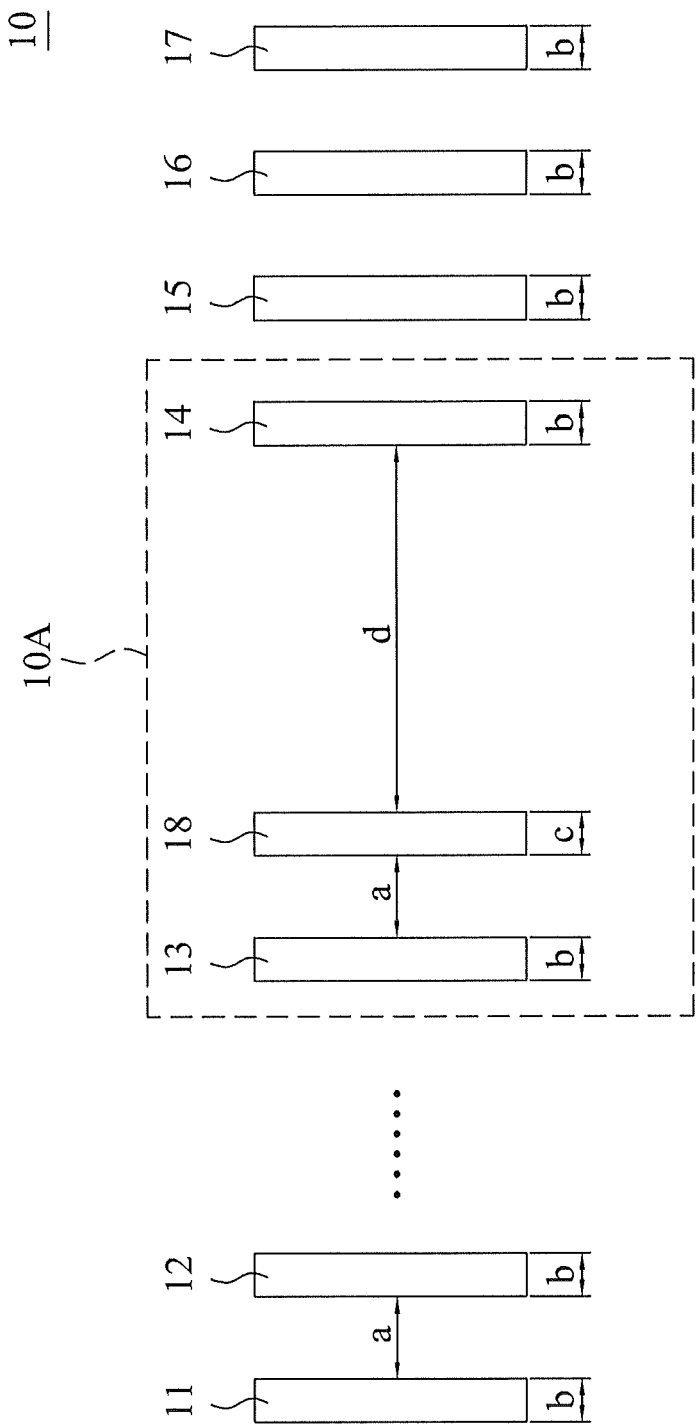
FIG. 1 illustrates a photomask layout according to one embodiment of the present invention.

FIG. 1 illustrates a photomask layout 10 according to one embodiment of the present invention. The photomask layout 10 shown in FIG. 1 comprises a plurality of first line patterns 11 to 17 and a second line pattern 18. In this embodiment, the photomask layout 10 comprises at least one region 10A which includes the two first line patterns 13, 14 having a first width b and the second line pattern 18 having a second width c. The second line pattern 18 is between and substantially parallel to the two first line patterns 13, 14, and there exist a first distance a and a second distance d between the second line pattern 18 and the two first line patterns 13, 14.

Figure 2:
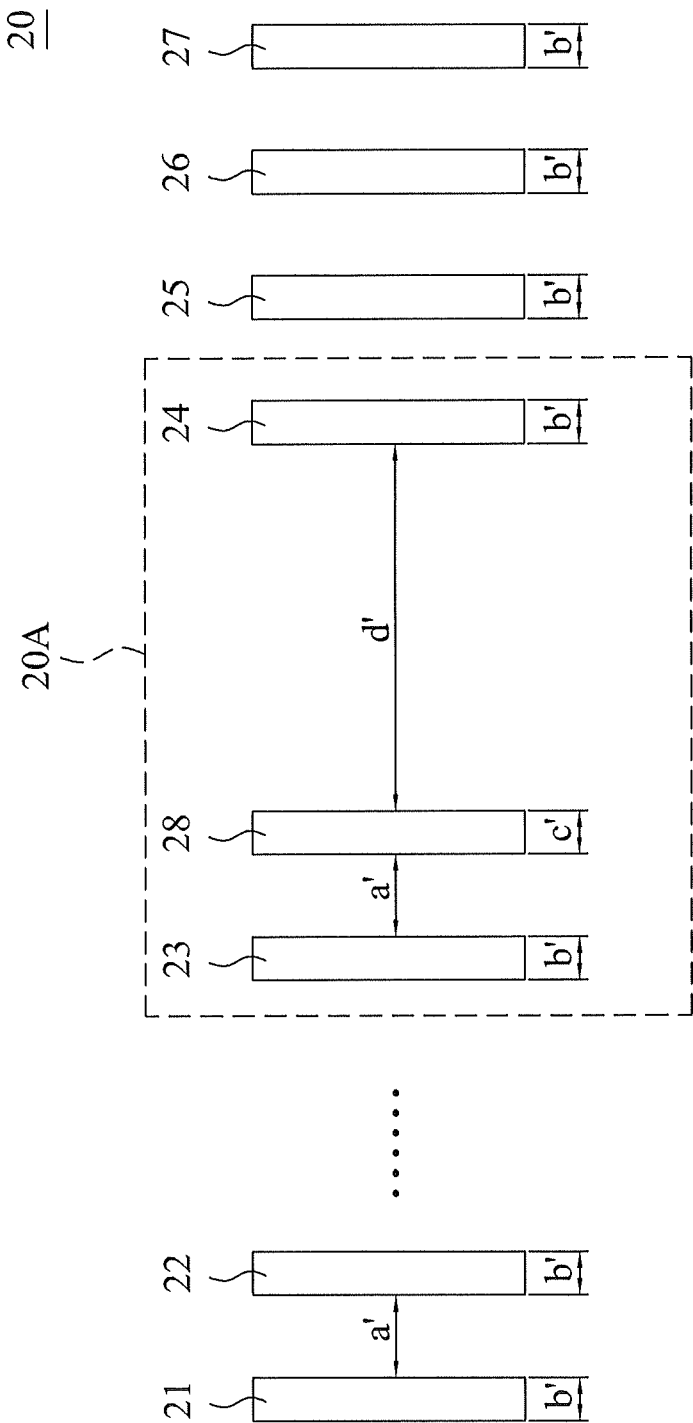
FIG. 2 illustrates a photoresist pattern corresponding to the photomask layout according to one embodiment of the present invention.

FIG. 2 illustrates a photoresist pattern 20 corresponding to the photomask layout 10 according to one embodiment of the present invention.

Referring to FIGS. 1 and 2, in this embodiment, a plurality of first line patterns 21 to 27 and a second line pattern 28 correspond to the first line patterns 11 to 17 and the second line pattern 18, respectively. A portion 20A of the photoresist pattern 20 which corresponds to the second line pattern 28 includes the two first line patterns 23, 24 having a first width b' and the second line pattern 28 having a second width c'. The second line pattern 28 is between and substantially parallel to the two first line patterns 23, 24, and there exist a first distance a' and a second distance d' between the second line pattern 28 and the two first line patterns 23, 24. It should be noted that the photoresist pattern 20 may be a bilayer photoresist pattern, but is not limited thereto.

After an OPC, the photoresist pattern 20 may be different from the photomask layout 10 (i.e., a', b', c' and d' are different from a, b, c and d), and the photoresist pattern 20 may collapse somewhere.

In one embodiment of the present invention, a model of defining a photoresist pattern collapse rule comprises two first dimensions, a second dimension, a third dimension and a fourth dimension. The two first and second dimensions correspond to two first widths b of two first line patterns 13, 14 and a second width c of a second line pattern 18 of the photomask layout 10. In this model, a portion (such as the portion 20A) of the photoresist pattern 20 which corresponds to the second line pattern 18 is defined as non-collapse patterns if $d \geq 5a$ and $c \geq 1.5b$ or if $5a > d \geq 3a$ and $c \geq 1.2b$, and preferably, the first width $b \leq 130$ nanometer (nm) and $a \leq 1.2b$.

Figure 3:
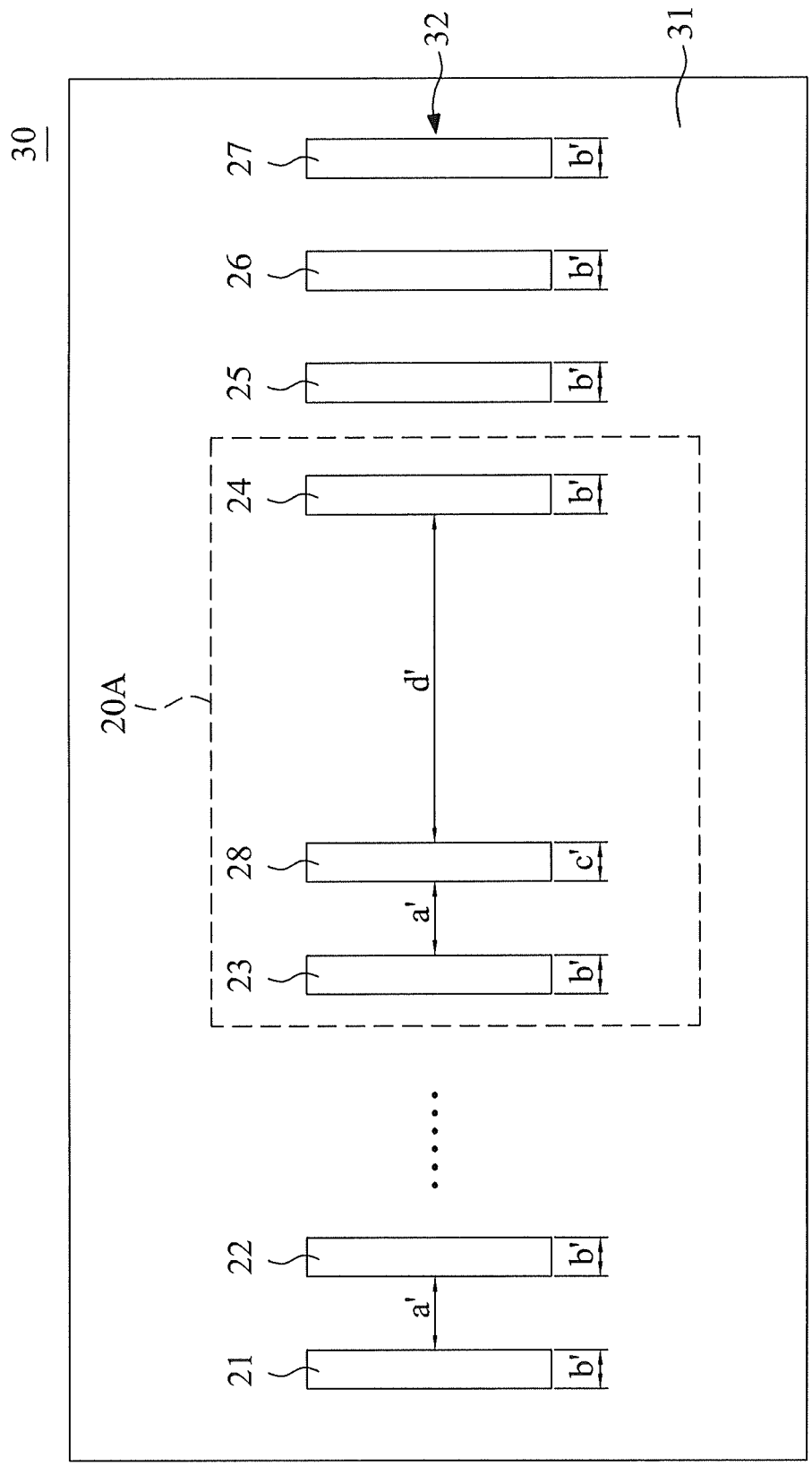
FIGS. 3 and 4 illustrate a semiconductor substrate including a photoresist layer which has a photoresist pattern for preventing photoresist pattern collapse for post-optical proximity correction according to one embodiment of the present invention.
Figure 4:
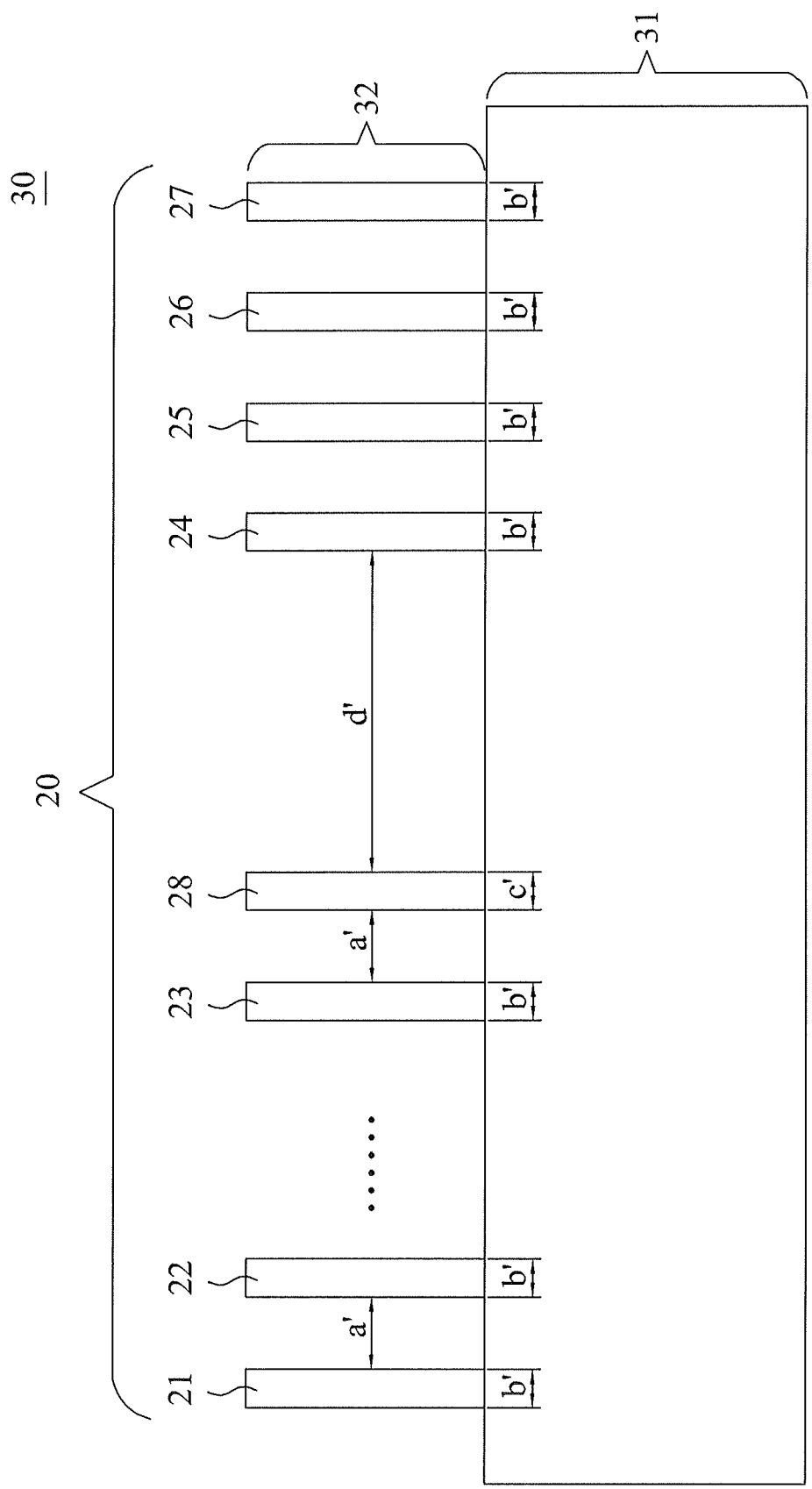

FIGS. 3 and 4 illustrate a semiconductor substrate 30 including a photoresist layer 32 which has a photoresist pattern 20 for preventing photoresist pattern collapse for post-optical proximity correction according to one embodiment of the present invention. Referring to FIGS. 2 to 4, in this embodiment, a semiconductor substrate 30 includes a first layer 31 and a photoresist layer 32, wherein the photoresist layer 32 has a photoresist pattern 20 and is disposed on the first layer 31. It should be noted that the first layer 31 may include a plurality of layers.

Referring to FIGS. 1 to 4, the photoresist pattern 20 corresponds to the photomask layout 10 comprising at least one region 10A which includes two first line patterns 13, 14 having a first width b and a second line pattern 18 having a second width c. In the photomask layout 10, a first distance a and a second distance d exist between the second line pattern and the two first line patterns of the photomask layout. The semiconductor substrate 30 including the photoresist layer 32 which has the photoresist pattern 20 correspondingly with non-collapse conditions, $d \geq 5a$ and $c \geq 1.5b$ or $5a > d \geq 3a$ and $c \geq 1.2b$, can prevent photoresist pattern collapse for post-optical proximity correction.

To check for photoresist pattern collapse, a method for defining photoresist pattern collapse for post-optical proximity correction of the present invention is provided.

Figure 5:
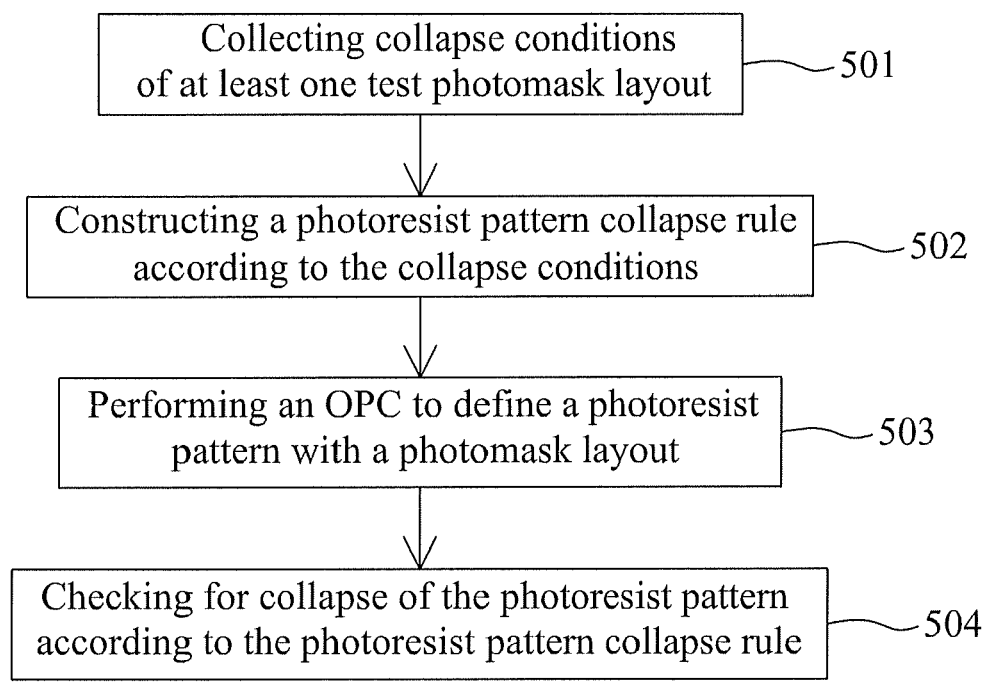
FIG. 5 is a flow diagram illustrating a method for defining photoresist pattern collapse for post-optical proximity correction according to one embodiment of the present invention.

FIG. 5 is a flow diagram illustrating a method for defining photoresist pattern collapse for post-optical proximity correction according to one embodiment of the present invention. Referring to step 501, collapse conditions of at least one test photomask layout (not shown) according to collapse portions of at least one test photoresist pattern (not shown) which is formed by the at least one test photomask layout are collected.

Referring to step 502, a photoresist pattern collapse rule is constructed according to the collapse conditions. In the photoresist pattern collapse rule, the non-collapse conditions are set to $d \geq 5a$ and $c \geq 1.5b$ or $5a > d \geq 3a$ and $c \geq 1.2b$.

Referring to step 503, an OPC is performed to define a photoresist pattern 20 with a photomask layout 10. Referring to step 504, collapse of the photoresist pattern 20 is checked according to the photoresist pattern collapse rule.

In one embodiment of the present invention, a method of the invention may further comprise a step of modifying collapse portions which are defined by the photoresist pattern collapse rule, so as to meet the non-collapse requirement of the photoresist pattern collapse rule, thereby preventing photoresist pattern collapse.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for defining photoresist pattern collapse for post-optical proximity correction (post-OPC), comprising steps of:

collecting collapse conditions of at least one test photomask layout according to collapse portions of at least one test photoresist pattern which is formed by the at least one test photomask layout;

constructing a photoresist pattern collapse rule according to the collapse conditions;

performing an OPC to define a photoresist pattern with a photomask layout; and checking for collapse of the photoresist pattern according to the photoresist pattern collapse rule.

2. The method for defining photoresist pattern collapse for post-optical proximity correaction of claim 1, wherein the photomask layout comprises two first line patterns having a first width and a second line pattern having a second width, the second line pattern is between and substantially parallel to the two first line patterns, and there exist a first distance and a second distance between the second line pattern and the two first line patterns, wherein a portion of the photoresist pattern which corresponds to the second line pattern is defined as non-collapse patterns if $d \geq 5a$ and $c \geq 1.5b$ or if $5a > d \geq 3a$ and $c \geq 1.2b$;

wherein a represents the first distance, b represents the first width, c represents the second width, and d represents the second distance; and wherein a, b, c and d are real numbers greater than zero.

3. The method for defining photoresist pattern collapse for post-optical proximity correction of claim 2, wherein $b \leq 130$ nanometer and $a \leq 1.2b$.

4. The method for defining photoresist pattern collapse for post-optical proximity correction of claim 1, further comprising a step of modifying collapse portions which are defined by the photoresist pattern collapse rule, so as to meet a non-collapse requirement of the photoresist pattern collapse rule.

5. The method for defining photoresist pattern collapse for post-optical proximity correction of claim 1, wherein the photoresist pattern is a bilayer photoresist pattern.

\* \* \* \* \*